United States Patent [19]

Matsushita

[11] 4,193,783

[45] Mar. 18, 1980

[54] METHOD OF TREATING A SILICON SINGLE CRYSTAL INGOT

[75] Inventor: Yoshiaki Matsushita, Toyko, Japan

[73] Assignee: VLSI Technology Research Association, Kawasaki, Japan

[21] Appl. No.: 915,870

[22] Filed: Jun. 15, 1978

[30] Foreign Application Priority Data

Jun. 15, 1977 [JP] Japan .................................. 52/70625

[51] Int. Cl.² ................................................ C03C 15/00

[52] U.S. Cl. ........................................... 65/31; 65/104; 65/105; 65/112; 65/DIG. 15; 156/600; 156/DIG. 64; 156/DIG. 73

[58] Field of Search .................... 65/31, 104, 105, 117, 65/DIG. 15, 112; 156/600, DIG. 64, DIG. 73

[56] References Cited

U.S. PATENT DOCUMENTS 3,266,961 8/1966 Emeis .................................. 65/31 X

FOREIGN PATENT DOCUMENTS 52-26160 2/1977 Japan .

52-26161 2/1977 Japan .

OTHER PUBLICATIONS

"Minimizing, Process-Induced Slip in Silicon Wafers by Slow Heating and Cooling", Journal Electrochemical Society (U.S.A.) vol. 123, No. 3, Mar. 1976, pp. 434-435, by W. A. Fisher and G. L. Schnable.

"Argon Implantation Gettering for a 'Through Oxide' Arsenic-Implanted Layer" by K. Murase & H. Haradd, Journal of Applied Physics, vol. 48, No. 10, Oct. 1977, pp. 4404-4406.

*Primary Examiner*—Arthur D. Kellogg

*Attorney, Agent, or Firm*—Finnegan, Henderson, Farabow & Garrett

[57] ABSTRACT

A method of treating a silicon single crystal ingot which comprises the steps of purposely producing lattice strains in a silicon single crystal ingot, annealing the ingot at high temperature, and etching off the surface of the annealed ingot, thereby suppressing the occurrence of lattice defects.

35 Claims, 7 Drawing Figures

5 5 4

METHOD OF TREATING A SILICON SINGLE CRYSTAL INGOT

BACKGROUND OF THE INVENTION

This invention relates to a method of treating a silicon single crystal ingot used in the manufacture of a semiconductor device, and more particularly to a method of treating a silicon single crystal ingot to suppress the occurrence of lattice defects in the silicon single crystal during the manufacture of a semiconductor device.

Silicon is a most important material of a semiconductor device. Recent development of a large scale integrated circuitry has come to demand a silicon single crystal having a more perfect crystal structure. Lattice defects of a silicon single crystal such as stacking faults, dislocations and precipitates very adversely affect the properties and performance of a semiconductor device manufactured from the silicon single crystal. Stacking faults in particular exert very harmful effects on a semiconductor device. For example, the stacking faults increase leakage current at P-N junctions, or reduce the period during which carriers are stored in a charge-coupled device. As mentioned above, lattice defects of a silicon single crystal undesirably cause many disqualified semiconductor devices to be produced, eventually decreasing the yield thereof.

The above-mentioned lattice defects are formed during the manufacture of a semiconductor element from a silicon single crystal ingot. The occurrence of stacking faults in particular is largely affected and accelerated by the presense of impurities such as oxygen, carbon and heavy metals which are unavoidably carried into a silicon single crystal ingot during its growth. The stacking faults tend to arise prominently when the silicon single crystal undergoes oxidation treatment at high temperature.

To date, some processes have been proposed to suppress the occurrence of the lattice defects. One prior art process is to generate a mechanical strain field on the back side of a wafer cut out of a silicon single crystal ingot, thereafter the wafer is heat treated at high temperature. However, this conventional process which treats the respective wafers is very troublesome, and moreover has to be carried out with respect to all the semiconductor-manufacturing steps in which the stacking faults are likely to take place. Therefore, this conventional process for treating the wafer makes the manufacture of a semiconductor device very inefficient.

SUMMARY OF THE INVENTION

It is accordingly the object of this invention to provide a method of treating a silicon single crystal ingot which suppresses the occurrence of lattice defects in a silicon single crystal during the manufacture of a semiconductor device from said silicon single crystal ingot. The inventive process ensures the quantity production of the semiconductor device.

According to this invention, there is provided a method of treating a silicon single crystal ingot which comprises the steps of purposely producing lattice strains on the surface of the silicon single crystal ingot; annealing the ingot at high temperature; and etching off said surface of the annealed ingot, thereby suppressing the appearance of lattice defects during the subsequent manufacture of a semiconductor element.

DETAILED DESCRIPTION OF THE INVENTION

The treating method of this invention is suitably applicable to a silicon single crystal ingot. This silicon single crystal ingot is generally grown by the Czochralski method or the float zone method. The treating method of the invention is applied to a silicon single crystal ingot grown by the Czochralski method in the direction of, for example, (111) with a diameter of about 75 mm.

Figure 1:
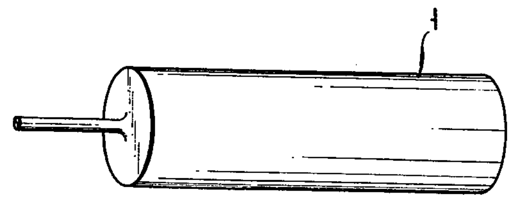
FIG. 1 is a schematic perspective view of a silicon single crystal ingot grow by the pull method.
Figure 2:
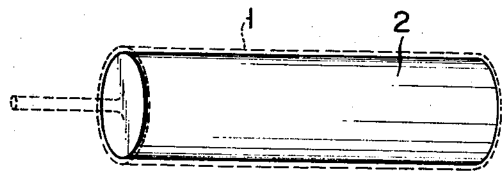
FIG. 2 is a schematic perspective view of a silicon single crystal ingot in which lattice strains were purposely produced by grinding the surface of the ingot to shape it into a regular round columnar form.
Figure 3:
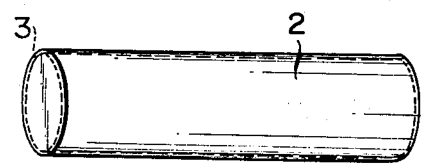
FIG. 3 is a schematic perspective view of the silicon single crystal ingot of FIG. 2 which was annealed to form an oxide film on the surface.
Figure 4:
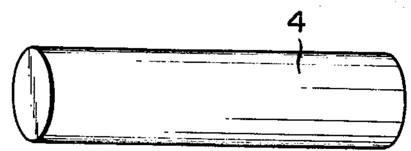
FIG. 4 is a schematic perspective view of the silicon single crystal ingot of FIG. 3 with its surface etched off.
Figure 5:
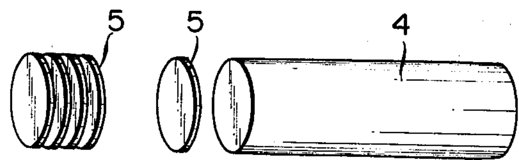
FIG. 5 is a schematic perspective view of the treated silicon single crystal ingot and wafers sliced off therefrom.

The first step of purposely producing lattice strains on the surface of a silicon single crystal ingot 1 is effected by mechanical grinding or ion implantation of, for example, argon or xenon, or formation of an oxide layer. Most convenient is the process of mechanically grinding the surface of the silicon single crystal ingot to manufacture the ingot in a round columnar form and to produce lattice strains thereon. In this case, the surface of the silicon single crystal ingot 1 is ground by a centerless grinder, thereby providing a round columnar ingot 2 of FIG. 2.

In the second step, preferably, the round columnar ingot 2 is annealed with heat applied at least 15 hours at a temperature of 1000° to 1200° C., followed by slow cooling at a smaller rate than 100° C./min. Where heating is applied at a lower temperature than 1000° C., impurities in the silicon single crystal ingot 2 are not fully diffused, failing to provide a satisfactory effect. It is more preferred to heat the ingot 2 from 15 to 100 hours at a temperature of 1050° to 1100° C. The kind of atmosphere in which said annealing is carried out is not subject to any particular limitation. However, an atmosphere of wet or dry oxygen gas is preferred. This oxidizing atmosphere forms an oxide layer 3 on the surface of the silicon single crystal ingot 2, therefore the oxide layer 3 further generates lattice strains on said surface. Also preferred is an atmosphere of inert gas such as nitrogen or argon gas. However, heating in an atmosphere of inert gas should preferably be continued somewhat longer than in an oxidizing atmosphere. The subsequent slow cooling should be carried out preferably at a smaller rate than 100° C./min or more preferably than 50° C./min. The reason is that quenching of a highly heated silicon single crystal ingot tends to cause slip lines to be formed from the surface of said ingot to the interior thereof, and in some cases leads to the possibility of said ingot being broken.

In the last step, the silicon single crystal ingot 2 annealed in the preceding step has the surface etched off. This etching is effected by dipping the ingot 2 in an etchant formed of a mixture of hydrofluoric acid and nitric acid (typically mixed in the ratio of 1:4). The surface portion of the ingot 2 which should be etched off is that in which lattice strains are produced in the first step, or that on which the oxide layer 3 is deposited, and those areas lying more inward than these portions. If the surface of the ingot 2 is etched off to a depth of about 500 microns, it will well serve the purpose, though said depth may vary with the condition in which the annealing of the second step is undertaken.

With a silicon single crystal ingot 5 treated by the above-mentioned method of this invention, not only impurities previously present in the ingot are substantially removed, but also lattice defects do not arise in a silicon wafer during the subsequent manufacture of a semiconductor element. These favorable events are assumed to result from the fact that impurities such as oxygen, carbon, and heavy metals present in a silicon single crystal ingot diffuse into those portions of the ingot in which lattice strains are produced and later are etched off.

Silicon wafers 5 are sliced off by, for example, a diamond cutter from a silicon single crystal ingot 4 treated as described above. The wafer 5 is lapped and polished to be used as a semiconductor substrate.

Figure 6:
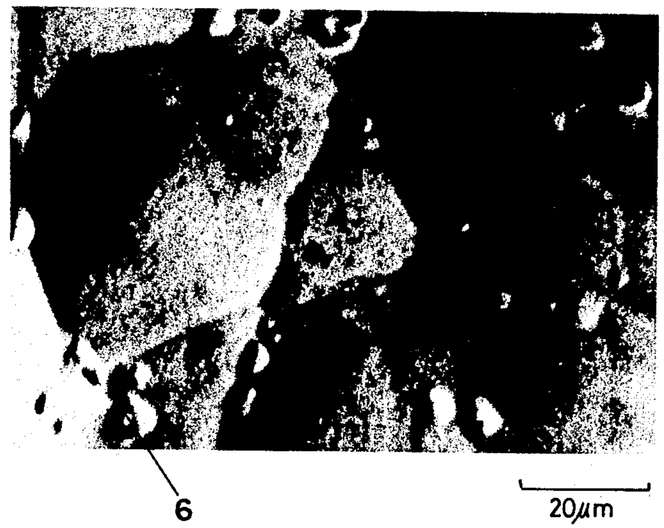
FIG. 6 is a microscopic photograph of a Sirtl-etched wafer sliced off from a silicon single crystal ingot which was subjected to treatment of this invention, and later oxidized.
Figure 7:
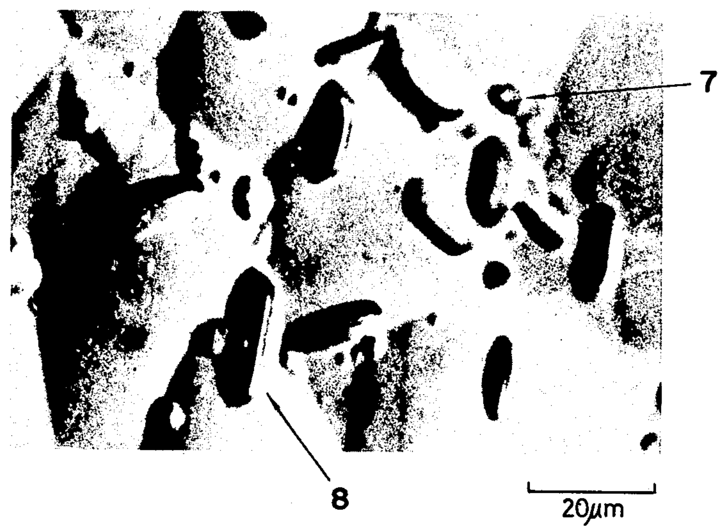
FIG. 7 is a microscopic photograph of a Sirtl-etched wafer sliced off from a silicon single crystal ingot which was not subjected to treatment of this invention, but only oxidized.

The following tests were made of the occurrence of lattice defects during the manufacture of a semiconductor device made from silicon wafers sliced off from a silicon single crystal ingot treated by the method of this invention. The silicon wafer was oxidized 40 minutes in an atmosphere of wet oxygen gas at 1100° C. The oxide layer was etched off by hydrofluoric acid, followed by the Sirtl-etching. A micrograph was taken of the resultant wafer under a Nomarski interference microscope. The micrograph shows that the silicon wafer cut out of the silicon single crystal ingot treated by the method of this invention only indicated shallow pits 6 but not stacking faults, as illustrated in FIG. 6. In contrast, test made of the prior art silicon wafer obtained from a silicon single crystal ingot which was not treated by the method of this invention show that, as seen from FIG. 7, not only shallow pits 7 but also numerous stacking faults 8 appeared.

The above tests prove that the treating method of this invention effectively eliminates stacking faults adversely affecting the properties and performance of a semiconductor device. Moreover, the treating method of the invention is directly applicable to a silicon single crystal ingot and offers greater convenience and proves more adapted for quantity manufacture of a semiconductor device on an industrial scale than the prior art process. Therefore, application of the treating method of the invention makes it possible to manufacture a semiconductor device, particularly a large scale integrated circuit efficiently with high yield.

This invention will be more fully understood by reference to the following example. This example is intended to indicate the effect which the heating time applied during the annealing step exerts on suppression of lattice defects.

EXAMPLE

Eight silicon single crystal ingots prepared by the Czochralski method had the entire surface ground by a centerless grinder into the round columnar form. The eight ground ingots were heated for a certain length of time at 1100° C. in an atmosphere of wet oxygen gas. The eight different lengths of heating time applied at 1100° C. for the round columnar ingots were 1 hours, 2 hours, 5 hours, 10 hours, 15 hours, 24 hours, 36 hours and 48 hours, respectively. The surface of the annealed sample ingots was etched off by an etchant formed of a mixture of hydrofluoric acid and nitric acid. Wafers were sliced off from the eight etched sample ingots. Wafers were provided to carry out the same tests as previously described. The surface of Sirtl-etched wafers were observed under the Nomarski interference microscope. A large number of stacking faults appeared in the wafers sliced off from the ingots heated 1 hour and 2 hours respectively. The wafers obtained from the ingots heated 5 hours and 10 hours respectively indicated stacking faults at the center, though not in the peripheral portion. The wafers cut out of the ingots heated more than 15 hours were free from stacking faults, but still indicated other lattice defects than stacking faults, for example, shallow pits. The density of such lattice defects accounted for about 40% for wafers derived from the 15-hour heated ingot; about 20% for wafers resulting from the 24-hour heated ingot; about 10% for wafers obtained from the 36-hour heated ingot; and about 10% even for wafers sliced off from the 48-hour heated ingot. As described above, the occurrence of other lattice defects than stacking faults became less noticeable as the heating time of the second step was extended longer.

What we claim is:

1. A method of preparing silicon wafers from a silicon, single crystal ingot comprising the steps of:
- purposely producing lattice strains in the surface of the silicon, single crystal ingot,
- heating the ingot at least 15 hours at a temperature between 1,000° C. and 1,200° C.,
- cooling the ingot
- etching off the surface of the ingot to at least the depth that the lattice strains are purposely produced, and
- cutting silicon wafers from the etched ingot.

2. The method of claim 1 wherein the lattice strains are produced by mechanically grinding the surface of the ingot.

3. The method of claim 1 wherein the lattice strains are produced by implanting ions in the surface of the ingot.

4. The method of claim 1 wherein the lattice strains are produced by forming an oxide layer on the surface of the ingot.

5. A method of preparing silicon wafers from a silicon, single crystal ingot comprising the steps of:
- mechanically grinding a surface on the silicon, single crystal ingot to produce lattice strains therein,
- heating the ingot at least 15 hours at a temperature between 1,000° C. and 1,200° C.,
- cooling the ingot and
- etching off the surface of the ingot to at least the depth that the lattice strains are purposely produced, and
- cutting silicon wafers from the etched ingot.

6. The method of claim 5 wherein the silicon, single crystal ingot is prepared by the Czochralski method.

7. The method of claim 5 wherein the silicon, single crystal ingot is prepared by the float zone method.

8. The method of claim 5 wherein the step of mechanically grinding comprises grinding the ingot with a centerless grinder to produce a round columnar ingot.

9. The method of claim 5 wherein the heating temperature is between 1,050° C. and 1,100° C.

10. The method according to claim 5 wherein the heating temperature is 1,100° C.

11. The method according to claim 5 wherein the heating is carried out in an oxidizing atmosphere.

12. The method according to claim 5 wherein the heating is carried out in an inert atmosphere.

13. The method according to claim 11 wherein the oxidizing atmosphere is selected from the group consisting of dry and wet oxygen gases.

14. The method according to claim 5 wherein the heating step is continued from 15 to 100 hours.

15. The method according to claim 5 wherein the heating step is continued from 15 to 36 hours.

16. The method according to claim 5 wherein an etchant formed of a mixture of hydrofluoric acid and nitric acid is used in the etching step.

17. The method according to claim 5 wherein about 500 microns is etched off the surface of the ingot.

18. The method of claim 5 wherein the ingot is cooled at a rate not greater than 50° C. per minute.

19. The method of claim 1 wherein the lattice strains are produced by mechanically grinding the surface of the ingot.

20. The method of claim 1 wherein the lattice strains are produced by implanting ions in the surface of the ingot.

21. The method of claim 3 wherein the lattice strains are produced by forming an oxide layer on the surface of the ingot.

22. The method according to claim 5 wherein the ingot is cooled at a rate not greater than 100° C. per minute.

23. The method according to claim 1 wherein the ingot is cooled at a rate not greater than 100° C. per minute.

24. The method of claim 1 wherein the silicon, single crystal ingot is prepared by the Czochralski method.

25. The method of claim 1 wherein the silicon, single crystal ingot is prepared by the float zone method.

26. The method of claim 1 wherein the heating temperature is between 1,050° C. and 1,100° C.

27. The method according to claim 1 wherein the heating temperature is 1,100° C.

28. The method according to claim 1 wherein the heating is carried out in an oxidizing atmosphere.

29. The method according to claim 1 wherein the heating is carried out in an inert atmosphere.

30. The method according to claim 1 wherein the oxidizing atmosphere is selected from the group consisting of dry and wet oxygen gases.

31. The method according to claim 1 wherein the heating step is continued from 15 to 100 hours.

32. The method according to claim 1 wherein the heating step is continued from 15 to 36 hours.

33. The method according to claim 1 wherein an etchant formed of a mixture of hydrofluoric acid and nitric acid is used in the etching step.

34. The method according to claim 1 wherein about 500 microns is etched off the surface of the ingot.

35. The method of claim 1 wherein the ingot is cooled at a rate not greater than 50° C. per minute.

* * * * *